(12) United States Patent
Yuming et al.

(10) Patent No.: US 11,515,342 B2
(45) Date of Patent: Nov. 29, 2022

(54) GATE UNIT AND MANUFACTURING METHOD THEREOF, ARRAY SUBSTRATE MANUFACTURING METHOD, AND DISPLAY MECHANISM

(71) Applicants: Beihai HKC Optoelectronics Technology Co., Ltd., Beihai (CN); HKC Corporation Limited, Shenzhen (CN)

(72) Inventors: Xia Yuming, Shenzhen (CN); En-Tsung Cho, Shenzhen (CN); Chongwei Tang, Shenzhen (CN)

(73) Assignees: Beihai HKC Optoelectronics Technology Co., Ltd., Beihai (CN); HKC Corporation Limited, Shenzhen (CN)

( * ) Notice: Subject to any disclaimer, the term of this patent is extended or adjusted under 35 U.S.C. 154(b) by 0 days.

(21) Appl. No.: 17/352,846

(22) Filed: Jun. 21, 2021

(65) Prior Publication Data
US 2022/0028904 A1  Jan. 27, 2022

(51) Int. Cl.
*H01L 27/12* (2006.01)
*G02F 1/1368* (2006.01)
*H01L 21/288* (2006.01)

(52) U.S. Cl.
CPC ........ *H01L 27/1288* (2013.01); *G02F 1/1368* (2013.01); *H01L 21/2885* (2013.01)

(58) Field of Classification Search
CPC ............ H01L 27/1288; H01L 21/2885; G02F 1/1368
See application file for complete search history.

(56) References Cited

FOREIGN PATENT DOCUMENTS

CN   112018177 A  * 12/2020

OTHER PUBLICATIONS

English machine translation of CN112018177A (Year: 2020).*

* cited by examiner

*Primary Examiner* — Anne M Hines
(74) *Attorney, Agent, or Firm* — Seyfarth Shaw LLP

(57) ABSTRACT

A gate unit and a manufacturing method thereof, a method of manufacturing an array substrate, and a display mechanism are provided. The method of manufacturing a gate unit includes: providing a conductive layer on a substrate; forming a photoresist layer on a side of the conductive layer away from the substrate; exposing the photoresist layer, and then developing the photoresist layer to form a groove extending through the photoresist layer on the photoresist layer, so as to form the photoresist layer with a pattern; and electrochemically depositing a functional material on the photoresist layer with the pattern, and then removing the photoresist layer to obtain the conductive layer having a pattern layer formed thereon, so as to obtain the gate unit.

16 Claims, 6 Drawing Sheets

GATE UNIT AND MANUFACTURING METHOD THEREOF, ARRAY SUBSTRATE MANUFACTURING METHOD, AND DISPLAY MECHANISM

CROSS REFERENCE TO RELATED APPLICATION

The application claims priority to Chinese Patent Application No. 2020107330597, filed on Jul. 27, 2020 and entitled "GATE UNIT AND MANUFACTURING METHOD THEREOF, ARRAY SUBSTRATE MANUFACTURING METHOD, AND DISPLAY MECHANISM", which is incorporated herein by reference in its entirety.

TECHNICAL FIELD

The present disclosure relates to the field of display technologies, and more particularly to a gate unit and a manufacturing method thereof, a method of manufacturing an array substrate, and a display mechanism.

BACKGROUND

A thin film transistor (TFT)-type display screen is a kind of active matrix liquid crystal display device. Each liquid crystal pixel point on the TFT-type display screen is driven by a thin film transistor integrated behind the pixel point. The TFT-type display screen has the advantages of high responsivity, high brightness, high contrast, and the like, and is a mainstream display device. In general, a method of manufacturing an array substrate mainly includes the following steps: forming a metal layer on a substrate, and etching the metal layer to form a pattern. The array substrate obtained by this method has long charging time, which cannot meet actual demands.

SUMMARY

According to various embodiments of present disclosure, a gate unit and a manufacturing method thereof, a method of manufacturing an array substrate, and a display mechanism are provided.

A method of manufacturing a gate unit is provided, including:

providing a conductive layer on a substrate;

forming a photoresist layer on a side of the conductive layer away from the substrate;

exposing the photoresist layer, and then developing the photoresist layer to form a groove extending through the photoresist layer on the photoresist layer, so as to form the photoresist layer with a pattern; and electrochemically depositing a functional material on the photoresist layer with the pattern, and then removing the photoresist layer to obtain the conductive layer having a pattern layer formed thereon, so as to obtain the gate unit.

In the above method of manufacturing the gate unit, the conductive layer is disposed on the substrate, and the photoresist layer is formed on the side of the conductive layer away from the substrate. The photoresist layer is exposed and then developed to form, on the photoresist layer, the groove extending through the photoresist layer, so as to form the photoresist layer with the pattern. The functional material is electrochemically deposited on the photoresist layer with the pattern, and the photoresist layer is removed to obtain the conductive layer having the pattern layer formed thereon, so as to obtain the gate unit. The pattern layer with higher density can be obtained by electrochemically depositing the pattern layer, and the functional layer is laminated on the substrate. The gate unit 110 obtained by the manufacturing method can be used as a gate or a gate line to manufacture an array substrate with a shorter charging time. Upon experimental verification, the conductivity of the aforementioned gate unit ranges from $3.0*10^6$ S/m to $8.0*10^6$ S/m, and a time of charging pixels by the array substrate including the gate unit ranges from 10 μs to 15 μs.

In one embodiment, the step of electrochemically depositing the functional material on the photoresist layer with the pattern and then removing the photoresist layer to obtain the conductive layer having the pattern layer formed thereon includes: sequentially electrochemically depositing a metal material and a barrier material on the photoresist layer with the pattern, and then removing the photoresist layer to form a metal layer and a barrier layer that are laminated to obtain the pattern layer.

In one embodiment, the step of sequentially electrochemically depositing the metal material and the barrier material on the photoresist layer with the pattern includes:

placing the photoresist layer with the pattern in an electrolyte containing first ions and second ions;

electrifying the electrolyte under a first reduction potential or a first reduction current, so that the first ions are reduced and deposited on the photoresist layer with the pattern to form a metal material layer; and electrifying the electrolyte under a second reduction potential or a second reduction current, so that the second ions are reduced and deposited on the metal material layer to form a barrier material layer.

In one embodiment, the first ions are $Cu^{2+}$, the first reduction potential is 0.3419 V, a density of the first reduction current ranges from 1.5 $A/dm^2$ to 8.0 $A/dm^2$, the second reduction potential is −0.0036 V, and a density of the second reduction current ranges from 0.5 $A/dm^2$ to 1.2 $A/dm^2$.

In one embodiment, the first ions are $Cu^{2+}$, the first reduction potential is 0.3419 V, a density of the first reduction current ranges from 1.5 $A/dm^2$ to 8.0 $A/dm^2$, the second ions are $Ti^{2+}$, the second reduction potential ranges from −1.2 V to −1.7 V, and a density of the second reduction current ranges from 5 $A/dm^2$ to 50 $A/dm^2$.

In one embodiment, the step of sequentially electrochemically depositing the metal material and the barrier material on the photoresist layer with the pattern includes:

placing the photoresist layer with the pattern in a first electrolyte containing first ions to perform electrochemical deposition, so that the first ions are reduced and deposited on the photoresist layer with the pattern to form a metal material layer; and placing the photoresist layer having the metal material layer formed thereon in a second electrolyte containing second ions to perform electrochemical deposition, so that the second ions are reduced and deposited on the metal material layer to form a barrier material layer.

In one embodiment, prior to the step of placing the photoresist layer having the metal material layer formed thereon in the second electrolyte to perform electrochemical deposition, the method further includes a step of preparing the second electrolyte: adding the second ions into the first electrolyte to obtain the second electrolyte.

In one embodiment, the step of placing the photoresist layer with the pattern in the first electrolyte to perform electrochemical deposition includes: electrifying the first electrolyte under a first reduction potential or a first reduction current, so that the first ions are reduced and deposited on the photoresist layer with the pattern to form the metal material layer, the first ions are $Cu^{2+}$, the first reduction potential ranges from 0.34 V to 0.8 V, and a density of the first reduction current ranges from 1.5 $A/dm^2$ to 8 $A/dm^2$.

In one embodiment, the step of placing the photoresist layer having the metal material layer formed thereon in the second electrolyte to perform electrochemical deposition includes: electrifying the second electrolyte under a second reduction potential or a second reduction current, so that the second ions are reduced and deposited on the metal material layer to form the barrier material layer, the second ions are $MoO_4^{2-}$ or $Ti^{2+}$, wherein when the second ions are $MoO_4^{2-}$, the second reduction potential ranges from −0.3 V to 0.1 V, and a density of the second reduction current ranges from 0.5 $A/dm^2$ to 1.2 $A/dm^2$; and when the second ions are $Ti^{2+}$, the second reduction potential ranges from −1.2 V to −1.7 V, and a density of the second reduction current ranges from 5 $A/dm^2$ to 50 $A/dm^2$.

A gate unit manufactured by the aforementioned method of manufacturing the gate unit is provided.

A method of manufacturing an array substrate is provided, including:

providing a conductive layer on a substrate;

forming a photoresist layer on a side of the conductive layer away from the substrate;

exposing the photoresist layer, and then developing the photoresist layer to form a groove extending through the photoresist layer on the photoresist layer, so as to form the photoresist layer with a pattern;

electrochemically depositing a functional material on the photoresist layer with the pattern, and then removing the photoresist layer to obtain the conductive layer having a pattern layer formed thereon, so as to obtain a gate unit;

providing an insulating layer on a side of the gate unit away from the substrate;

providing an active layer and a data line on a side of the insulating layer away from the gate unit; and providing a source-drain electrode on a side of the active layer away from the insulating layer to obtain the array substrate.

In one embodiment, the step of providing the data line on the side of the insulating layer away from the gate unit includes: sequentially providing a metal layer and a photoresist layer on the side of the insulating layer away from the gate unit, and exposing and developing the photoresist layer through a yellow light process, and etching the metal layer to pattern the metal layer, so as to obtain the data line.

In one embodiment, the step of providing the source-drain electrode on the side of the active layer away from the insulating layer includes: sequentially providing a metal layer and a photoresist layer on the side of the active layer away from the insulating layer, and exposing and developing the photoresist layer through a yellow light process, and etching the metal layer to pattern the metal layer, so as to obtain the source-drain electrode.

In one embodiment, after the step of providing the active layer and the data line on the side of the insulating layer away from the gate unit and prior to the step of providing the source-drain electrode on the side of the active layer away from the insulating layer, the method further includes: providing an ohmic contact layer on the side of the active layer away from the insulating layer, and the ohmic contact layer is located between the active layer and the source-drain electrode.

A display mechanism is provided, including the aforementioned gate unit or an array substrate manufactured by the aforementioned method of manufacturing the array substrate.

In one embodiment, the display mechanism further includes a display panel and a control component.

In one embodiment, the control component includes at least one of a polarization module and a backlight module, the backlight module is configured to provide a backlight, and the polarization module is configured to polarize light.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

To illustrate the technical solutions according to the embodiments of the present invention or in the prior art more clearly, the accompanying drawings for describing the embodiments or the prior art are introduced briefly in the following. Apparently, the accompanying drawings in the following description are only some embodiments of the present invention, and persons of ordinary skill in the art can derive other drawings from the accompanying drawings without creative efforts.

DETAILED DESCRIPTION OF THE EMBODIMENTS

In order to facilitate understanding of the present disclosure, the present disclosure will be described more fully below with reference to the accompanying drawings. Alternative embodiments of the present disclosure are given in the accompanying drawings. However, the present disclosure may be implemented in many different forms and is not limited to the embodiments described herein. Rather, the purpose of these embodiments is to make the disclosure of this application more thorough and complete.

Unless defined otherwise, all technical and scientific terms used herein have the same meaning as commonly understood by one of ordinary skill in the art to which this application belongs. The terminology used in the specification of this application is for the purpose of describing specific examples only and is not intended to limit the application. As used herein, the term "and/or" includes any and all combinations of one or more of the relevant listed items.

It should be noted that when an element is referred to as being "connected" or "coupled" to another element, it can be directly connected or coupled to the other element or intervening elements may be present.

Figure 1:
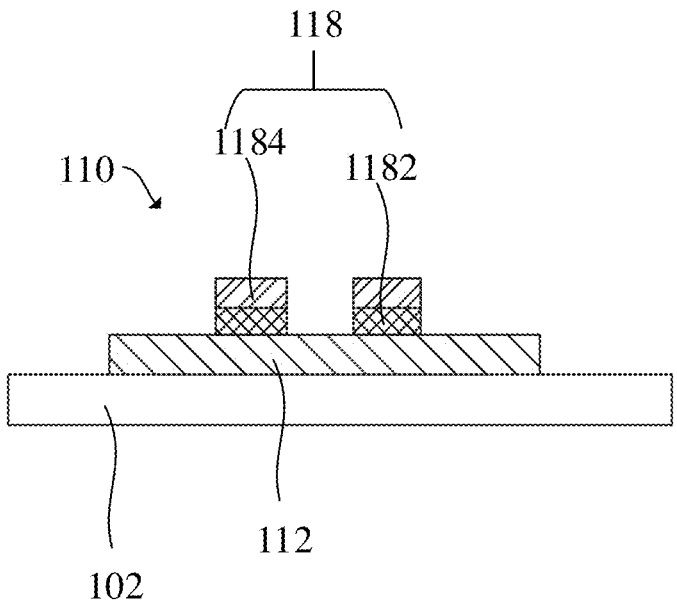
FIG. 1 is a schematic view of a gate unit according to a first embodiment.
Figure 2:
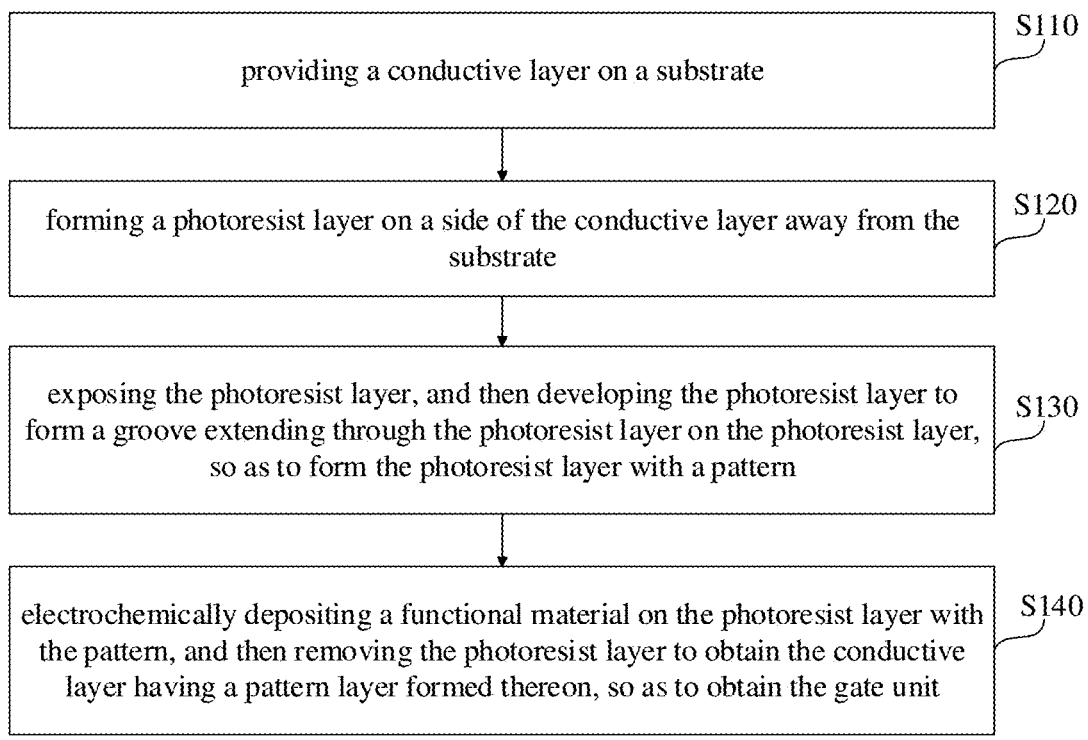
FIG. 2 is a flow chart of a method of manufacturing the gate unit of FIG. 1.

Referring to FIG. 1 and FIG. 2, a method of manufacturing a gate unit 110 according to a first embodiment is provided. The gate unit 110 obtained by the manufacturing method can be used as a gate or a gate line to manufacture an array substrate with a shorter charging time. Specifically, the method includes S110 to S140.

Figure 3:
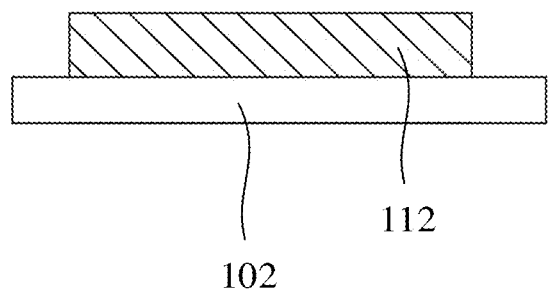
FIGS. 3 to 7 are schematic views illustrating structures corresponding to the related steps in the method of manufacturing the gate unit of FIG. 1.

Referring to FIG. 3 together, in S110, a conductive layer 112 is provided on a substrate 102.

The conductive layer 112 is provided on the substrate 102, so that adhesion between the gate unit 110 and the substrate 102 can be increased.

In one embodiment, the substrate 102 is a glass substrate, a plastic substrate, or a flexible substrate.

In one embodiment, the substrate 102 has a thickness ranging from 0.3 mm to 1.0 mm.

In one embodiment, the conductive layer 112 is a metal conductive layer. Further, the conductive layer 112 is a molybdenum layer or a titanium layer.

In one embodiment, in the step of providing the conductive layer 112 on the substrate 102, the conductive layer 112 is disposed on the substrate 102 by deposition. Further, the deposition is vapor deposition or electrochemical deposition. Furthermore, the deposition is vacuum evaporation, sputtering coating, arc plasma plating, or ion plating. It should be noted that the method of providing the conductive layer 112 on the substrate 102 is not limited to the above method, which may also be other methods such as chemical plating or atomic layer deposition.

In one embodiment, the conductive layer 112 has a thickness ranging from 300 A to 800 A.

Figure 4:
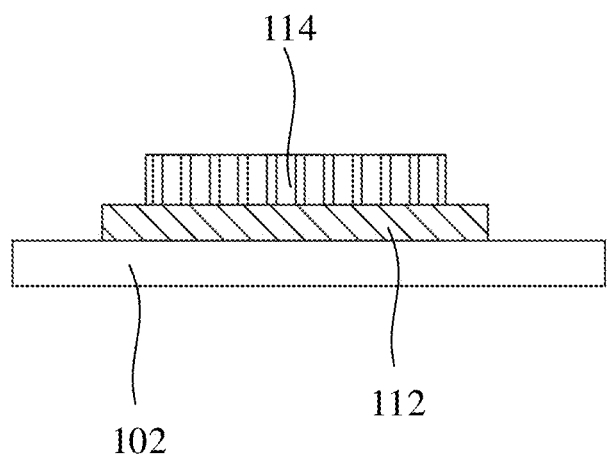

Referring to FIG. 4 together, in S120, a photoresist layer 114 is formed on a side of the conductive layer 112 away from the substrate 102.

Specifically, a photoresist is coated on the side of the conductive layer 112 away from the substrate 102 to obtain the photoresist layer 114.

In one embodiment, the photoresist layer 114 has a thickness ranging from 1.5 μm to 2.5 μm.

Figure 5:
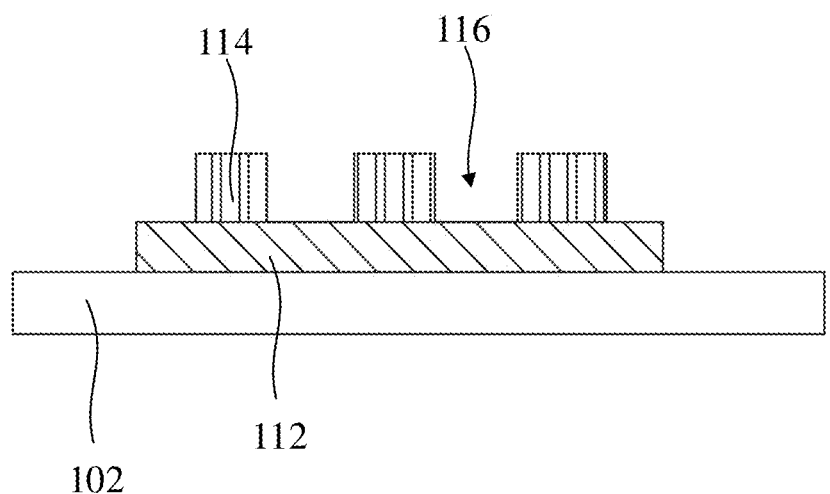

Referring to FIG. 5 together, in S130, an exposure process is performed on the side of the photoresist layer 114 away from the conductive layer 112, and then a groove 116 extending through the photoresist layer 114 is formed on the photoresist layer 114 through development to form the photoresist layer 114 with a pattern.

Specifically, the side of the photoresist layer 114 away from the conductive layer 112 is exposed by using a mask and then is developed, so that the photoresist layer 114 is provided with the groove 116 extending through the photoresist layer 114.

Figure 6:
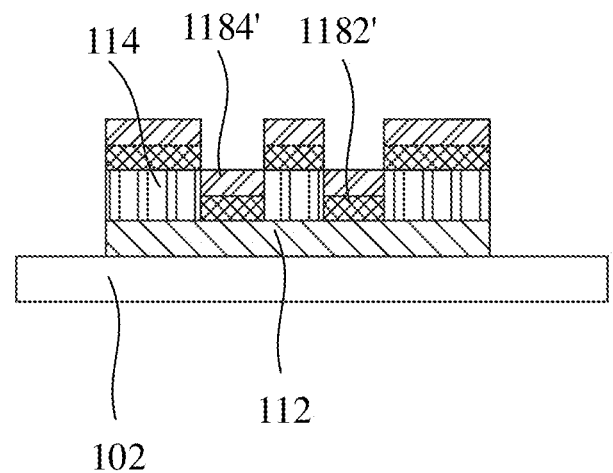

Referring to FIG. 6 together, in S140, a functional material is electrochemically deposited on the photoresist layer 114 with the pattern, and the photoresist layer 114 is removed to obtain the conductive layer 112 having a pattern layer 118 formed thereon, so as to obtain the gate unit 110.

In general, the conductive layer 112 having the pattern layer 118 formed thereon is obtained on the metal by etching a metal. The pattern layer 118 obtained by this method has low conductivity, which affects the performance of the array substrate including the gate unit 110. Electrochemical deposition is a technology in which, under the action of an external electric field, a coating is provided by the migration of positive and negative ions in an electrolyte solution and by a redox reaction of gained and lost electrons on an electrode. The pattern layer 118 prepared by the electrochemical deposition has high density and high conductivity, which is conducive to shortening the charging time of the array substrate including the gate unit 110, thereby ensuring the performance of the array substrate including the gate unit 110.

Further, the conductive layer 112 and the pattern layer 118 are sequentially laminated on the substrate 102.

In one embodiment, the temperature of the electrochemical deposition ranges from 10° C. to 35° C. By performing electrochemical deposition at room temperature, the conductivity of the pattern layer 118 can be improved by avoiding the decrease in the conductivity caused by poor flatness due to the provision of coarse particles.

In one embodiment, the step of electrochemically depositing a functional material on the photoresist layer 114 with the pattern, and removing the photoresist layer 114 to obtain the conductive layer 112 having the pattern layer 118 formed thereon includes: sequentially electrochemically depositing a metal material and a barrier material on the photoresist layer 114 with the pattern, and removing the photoresist layer 114 to form a metal layer 1182 and a barrier layer 1184 that are laminated to obtain the pattern layer 118. By providing the barrier layer 1184 on the metal layer 1182, the metal layer 1182 can be prevented from being oxidized or contaminated, so as to improve the adhesion between the metal layer 1182 and other components.

In one embodiment, the metal material is copper. It should be noted that the metal material is not limited to copper, and the metal material may also be other metal materials, such as aluminum. Further, the barrier material is molybdenum or titanium.

In one embodiment, the metal layer 1182 has a thickness ranging from 2000 A to 4000 A. The barrier layer 1184 has a thickness ranging from 300 A to 800 A.

In one embodiment, the metal layer 1182 is a copper layer. The metal layer 1182 being a copper layer can increase the conductivity of the gate unit 110, reduce the RC time (i.e., charging and discharging time), increase a refresh rate of the array substrate including the gate unit 110, and reduce the charging time of the array substrate. In general, hydrogen peroxide is used to etch the copper layer to obtain the conductive layer 112 having the pattern layer 118 formed thereon. The etching rate is relatively slow. Moreover, hydrogen peroxide is easy to be decomposed by high concentration metal ions, releasing a large amount of heat and resulting in explosion, which poses a great safety risk. In this embodiment, through electrochemical deposition, the metal layer 1182 can be disposed without etching. The deposition speed is fast, and the explosion caused by decomposition and heat release of hydrogen peroxide can be avoided, with high safety. Further, the barrier layer 1184 is a molybdenum layer or a titanium layer.

It should be noted that the metal layer 1182 is not limited to the copper layer, and the metal layer 118 may also be other components, such as an aluminum layer.

In one embodiment, in the step of sequentially electrochemically depositing the metal material and the barrier material on the photoresist layer 114 with the pattern, the metal material and the barrier material are sequentially electrochemically deposited on the photoresist layer 114 with the pattern. The metal material and the barrier material are sequentially and continuously electrochemically deposited to shorten a time interval between the provision of the metal layer 1182 and the provision of the barrier layer 184 and further reduce oxidation of the metal layer 1182, so as to improve the adhesion between the metal layer 1182 and other components.

Figure 7:
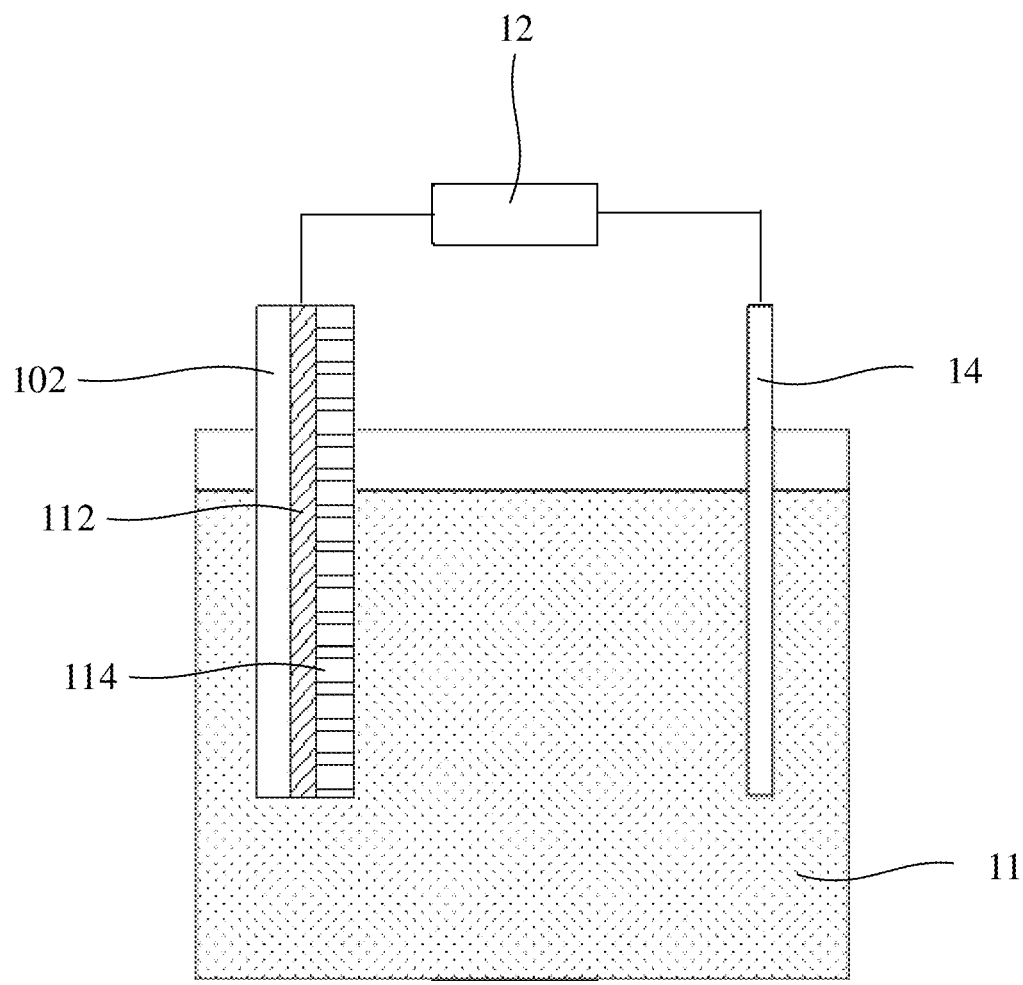

Referring to FIG. 7 together, in one embodiment, the step of sequentially electrochemically depositing the metal material and the barrier material on the photoresist layer 114 with the pattern includes: placing the photoresist layer 114 with the pattern in an electrolytic cell 11, and placing the conductive layer 112 and a counter electrode 14, which are electrically connected to both ends of a power supply 12, respectively, in an electrolyte to perform electrochemical deposition. Further, the photoresist layer 114 is disposed opposite to the counter electrode 14.

In one embodiment, the step of sequentially electrochemically depositing the metal material and the barrier material on the photoresist layer 114 with the pattern includes: placing the photoresist layer 114 with the pattern in an electrolyte containing first ions and second ions; electrifying the electrolyte under a first reduction potential or a first reduction current, so that the first ions are reduced and deposited on the photoresist layer 114 with the pattern to form a metal material layer 1182'; and electrifying the electrolyte under a second reduction potential or a second reduction current, so that the second ions are reduced and deposited on the metal material layer 1182' to form a barrier material layer 1184'. The metal layer 1182' and the barrier layer 1184' can be deposited sequentially and continuously by changing the potential to prevented the metal layer 1182' from being oxidized or contaminated. Further, the power supply 12 is a pulsed power supply 12.

In one embodiment, the first ions are $Cu^{2+}$. The second ions are $MoO_4^{2-}$ or $Ti^{2+}$. During the electrochemical deposition, a reaction formula of $Cu^{2+}$ is $Cu^{2+}+2e=Cu$, and a reaction formula of $MoO_4^{2-}$ is $MoO_4^{2-}+8H^++6e\text{-}=Mo+2H_2O$. It should be noted that the first ions are not limited to $Cu^{2+}$, which may also be other ions, such as $Al^{3+}$.

Further, when the first ions are $Cu^{2+}$ and the second ions are $MoO_4^{2-}$, the counter electrode 14 is a Pt (platinum) electrode or a Ti (titanium) electrode. It should be noted that a corresponding counter electrode 14 can be provided according to different first ions and second ions, to reduce the first ions and second ions.

In one embodiment, the first ions are $Cu^{2+}$, and the first reduction potential is 0.3419 V.

In one embodiment, the first ions are $Cu^{2+}$, and a density of the first reduction current ranges from 1.5 $A/dm^2$ to 8 $A/dm^2$.

In one embodiment, the second ions are $MoO_4^{2-}$, and the second reduction potential is −0.0036 V.

In one embodiment, the second ions are $MoO_4^{2-}$, and a density of the second reduction current ranges from 0.5 $A/dm^2$ to 1.2 $A/dm^2$.

In one embodiment, the second ions are $Ti^{2+}$, and the second reduction potential ranges from −1.2 V to −1.7 V.

In one embodiment, the second ions are $Ti^{2+}$, and a density of the second reduction current ranges from 5 $A/dm^2$ to 50 $A/dm^2$.

In one embodiment, further, the first ions are $Cu^{2+}$, the second ions are $MoO_4^{2-}$, the second reduction potential is −0.0036 V, and the first reduction potential is 0.3419 V. Such provision can ensure that the second ions will not be reduced while the first ions are reduced, and that the second ions are reduced without affecting the metal layer 1182 that has been disposed.

In one embodiment, the electrolyte contains 1.5 mol/L to 4.0 mol/L of first ions and 0.25 mol/L to 0.5 mol/L of second ions. Such provision can ensure the deposition of the metal layer 1182 and the barrier layer 1184 and ensure the performance of the pattern layer 118.

In one embodiment, the first ions are $Cu^{2+}$, and the electrolyte contains 1.5 mol/L to 4.0 mol/L of the first ions. In the preparation of the electrolyte, $Cu^{2+}$ is added in a form of soluble copper salt. Further, the soluble copper salt is at least one selected from the group consisting of copper sulfate, copper nitrate, and copper chloride. It should be noted that the soluble copper salt is not limited to the copper salts mentioned above, and may also be other common soluble copper salts in the electroplating process.

In one embodiment, the second ions are $MoO_4^{2-}$, and the electrolyte contains 0.25 mol/L to 0.5 mol/L of the second ions. In the preparation of the electrolyte, $MoO_4^{2-}$ is added in a form of soluble molybdate. Further, the soluble molybdate is at least one selected from the group consisting of sodium molybdate and potassium molybdate. It should be noted that the soluble molybdate is not limited to the soluble molybdate mentioned above, and may also be other common soluble molybdate in the electroplating process. Furthermore, the second ions are $MoO_4^{2-}$, and the electrolyte contains 1.5 mol/L to 4.0 mol/L of $Cu^{2+}$ and 0.25 mol/L to 0.5 mol/L of $MoO_4^{2-}$.

In one embodiment, the second ions are $Ti^{2+}$, and the electrolyte contains 0.25 mol/L to 0.5 mol/L of the second ions. In the preparation of the electrolyte, $Ti^{2+}$ is added in a form of soluble titanium salt. Further, the soluble titanium salt is at least one selected from the group consisting of titanium chloride and titanium sulfate.

Further, the electrolyte further contains 30 g/L to 100 g/L of acid. Further, the acid is at least one selected from the group consisting of $H_2SO_4$, HCl, and $H_3PO_4$. It should be noted that the acid is not limited to the acids mentioned above, and may also be other common acids in the electroplating process.

The electrolyte further contains 0.3 mL/L to 1 mL/L of brightener. Oil stains and impurities remaining on a surface of the metal are removed by the brightener, thereby maintaining the cleanness, glossiness, and color fastness of the exterior of the metal. Further, the brightener is at least one selected from the group consisting of sodium dodecyl sulfate, polyoxyethylene, and sodium propylene sulfonate. Polyoxyethylene (Polyethylene glycol, PEG) is PEG400, PEG1000, or PEG4000. It should be noted that the brightener is not limited to the brighteners mentioned above, and may also be other common brighteners in the electroplating process.

The electrolyte further contains a soluble chlorine salt. Further, the soluble chlorine salt is at least one selected from the group consisting of sodium chloride, potassium chloride, and magnesium chloride. In the electrolyte, a concentration of chloride ions of the soluble chlorine salt ranges from 30 mg/L to 120 mg/L. It should be noted that the soluble chlorine salt is not limited to the chlorine salts mentioned above, and may also be other common soluble chlorine salts in the electroplating process.

The electrolyte further contains 0.1 mL/L to 0.8 mL/L of a leveling agent. The addition of the leveling agent can improve the evenness of the coating and make a surface of the coating smoother. The leveling agent is at least one selected from the group consisting of polystyrene, polyacrylic acid, and polyvinyl alcohol. It should be noted that the leveling agent is not limited to the leveling agents mentioned above, and may also be other common leveling agents in the electroplating process.

The electrolyte further contains 0.1 mL/L to 1.5 mL/L of an additive. The additive is at least one selected from the group consisting of a lubricant and a plating cylinder. The plating cylinder can remove burrs of the coating.

In one embodiment, the electrolyte contains 1.5 mol/L to 4.0 mol/L of $Cu^{2+}$, 0.25 mol/L to 0.5 mol/L of $MoO_4^{2-}$, soluble chloride salt (a final concentration of chloride ions ranges from 30 mg/L to 120 mg/L), 30 g/L to 100 g/L of the acid, 0.3 mL/L to 1 mL/L of the brightener, 0.1 mL/L to 0.8 mL/L of the leveling agent, and 0.1 mL/L to 1.5 mL/L of the additive. The electrolyte is provided so that the metal layer 1182 and the barrier layer 1184 which are smooth and flat can be obtained, to ensure the conductivity of a gate 126.

In one embodiment, the photoresist layer 114 is removed by stripping the photoresist layer 114. Further, the photoresist layer 114 is removed by an ashing process. It should be noted that the metal material layer 1182' and the barrier material layer 1184' deposited on the photoresist layer 114 are removed together while the photoresist layer 114 is removed, so as to form the metal layer 1182 and the barrier layer 184 that are laminated.

In the illustrated embodiment, the gate unit 110 is selected from at least one of a gate and a gate line.

In the above method of manufacturing the gate unit 110, the conductive layer 112 is disposed on the substrate 102, and the photoresist layer 114 is formed on the side of the conductive layer 112 away from the substrate 102. The photoresist layer 114 is exposed and then developed to form, on the photoresist layer 114, the groove 116 extending through the photoresist layer 114, so as to form the photoresist layer 114 with the pattern. The functional material is electrochemically deposited on the photoresist layer 114 with the pattern, and the photoresist layer 114 is removed to obtain the conductive layer 112 having the pattern layer 118 formed thereon, so as to obtain the gate unit 110. The gate unit 110 includes the conductive layer 112 and the pattern layer 118 that are laminated. The pattern layer with higher density can be obtained by electrochemically depositing the pattern layer 118. The gate unit 110 obtained by the method can be used as a gate, a gate line, a data line, or a source-drain electrode to manufacture an array substrate with a shorter charging time. Upon experimental verification, the conductivity of the aforementioned gate unit 110 ranges from $3.0*10^6$ S/m to $8.0*10^6$ S/m, and a time of charging pixels by the array substrate including the gate unit 110 ranges from 10 µs to 15 µs. The gate unit 110 obtained by the aforementioned method can be used as a gate or a gate line, so that an array substrate with a shorter charging time can be manufactured.

In the aforementioned method of manufacturing the gate unit 110, the metal layer 1182 is disposed between the conductive layer 112 and the barrier layer 1184 by an electrochemical deposition process, which can avoid a problem that coarse particles are formed to affect poor surface flatness of the pattern layer 118, and thus avoid the problem of conductivity reduction of the metal layer 1182 due to the poor flatness of the pattern layer 118. In addition, the metal layer 1182 being made of copper can improve the conductivity of the metal layer 1182, reduce the RC time, improve the refresh rate of the array substrate including the gate unit 110, and reduce the charging time of the array substrate including the gate unit 110.

In the method of manufacturing the gate unit 110, by providing the electrolyte containing the first ions and the second ions and by controlling an impulse voltage, the metal layer 1182 and the barrier layer 1184 are deposited continuously, which can effectively avoid oxidization or contamination of the metal layer 1182 that affects the conductivity of the gate unit 110.

It may be understood that the method of manufacturing the gate unit 110 is not limited to the methods mentioned above, but may also be other methods. For example, a method of manufacturing the gate unit according to a second embodiment is substantially the same as the method of manufacturing the gate unit 110 according to the above embodiments. The difference lies in that the step of sequentially electrochemically depositing the metal material and the barrier material on the photoresist layer with the pattern includes: placing the photoresist layer with the pattern in a first electrolyte containing first ions to perform electrochemical deposition, so that the first ions are reduced and the metal material is deposited in the groove to form the metal material layer; and placing the photoresist layer having the metal material layer formed thereon in a second electrolyte containing second ions to perform electrochemical deposition, so that the second ions are reduced and deposited on the metal material layer to form a barrier material layer.

In one embodiment, the first electrolyte is substantially the same as the electrolyte in the above embodiments. The difference lies in that the first electrolyte does not contain the second ions.

In one embodiment, the second electrolyte contains the second ions with an initial concentration of 0.25 mol/L to 0.5 mol/L.

Further, the second electrolyte further contains 20 g/L to 70 g/L of acid. Further, the acid is at least one selected from the group consisting of $H_2SO_4$, HCl, and $H_3PO_4$. It should be noted that the acid is not limited to the acids mentioned above, and may also be other common acids in the electroplating process.

The second electrolyte further contains 0.2 mL/L to 0.8 mL/L of brightener. Further, the brightener is at least one selected from the group consisting of sodium dodecyl sulfate, polyoxyethylene, and sodium propylene sulfonate. Polyoxyethylene (Polyethylene glycol, PEG) is PEG400, PEG1000, or PEG4000. It should be noted that the brightener is not limited to the brighteners mentioned above, and may also be other common brighteners in the electroplating process.

The second electrolyte further contains 0.1 mL/L to 0.6 mL/L of a leveling agent. The leveling agent is at least one selected from the group consisting of polystyrene, polyacrylic acid, and polyvinyl alcohol. It should be noted that the leveling agent is not limited to the leveling agents mentioned above, and may also be other common leveling agents in the electroplating process.

The second electrolyte further contains 0.1 mL/L to 1.5 mL/L of an additive. The additive is at least one selected from the group consisting of a lubricant and a plating cylinder. It should be noted that the additive is not limited to the additives mentioned above, and may also be other common additives in the electroplating process.

In one embodiment, the second electrolyte contains, at an initial concentration, 0.25 mol/L to 0.5 mol/L of $MoO_4^{2-}$, 20 g/L to 70 g/L of acid, 0.2 mL/L to 0.8 mL/L of brightener, 0.1 mL/L to 0.6 mL/L of leveling agent, and 0.1 mL/L to 1.5 mL/L of an additive. The electrolyte is provided so that the metal layer and the barrier layer which are smooth and flat can be obtained, to ensure the conductivity of a gate.

In one embodiment, prior to the step of placing the photoresist layer having the metal material layer formed thereon in the second electrolyte to perform electrochemical deposition, the method further includes a step of preparing the second electrolyte: adding the second ions into the first electrolyte to obtain the second electrolyte. The second ions are added into the first electrolyte to obtain the second electrolyte, so that a time interval between the deposition of the metal material layer and the deposition of the barrier material layer can be shortened, so as to continuously deposit the metal material layer and the barrier material layer, thereby avoiding the oxidation or contamination of the metal layer.

Further, the step of sequentially electrochemically depositing the metal material and the barrier material on the photoresist layer with the pattern includes: placing the photoresist layer with the pattern in the first electrolyte to perform electrochemical deposition, so that the first ions are reduced and deposited on the photoresist layer with the pattern to form the metal material layer; and when the first ions in the first electrolyte are decreased to below 10 g/L, adding the second ions into the first electrolyte to obtain a second electrolyte and performing electrochemical deposition, so that the second ions are reduced and deposited on the metal material layer to form the barrier material layer. Such provision can not only continuously deposit the metal material layer and the barrier material layer, but also affect the deposition of the metal material layer and the barrier material layer by avoiding the mutual influence of the first ions and the second ions.

In one embodiment, an initial concentration of the first ions in the first electrolyte ranges from 1.5 mol/L to 4.0 mol/L, and an initial concentration of the second ions in the second electrolyte ranges from 0.25 mol/L to 0.5 mol/L.

In one embodiment, the second ions are $MoO_4^{2-}$, the initial concentration of the first ions in the first electrolyte ranges from 1.5 mol/L to 4.0 mol/L, and the second ions are added into the first electrolyte so that the initial concentration of the second ions ranges from 0.25 mol/L to 0.5 mol/L.

In one embodiment, the second ions are $Ti^{2+}$, the initial concentration of the first ions in the electrolyte ranges from 1.5 mol/L to 4.0 mol/L, and the second ions are added into the electrolyte so that the initial concentration of the second ions are 0.25 mol/L to 0.5 mol/L.

In one embodiment, in the step of placing the photoresist layer with the pattern in the first electrolyte to perform electrochemical deposition, so that the first ions are reduced and deposited on the photoresist layer with the pattern to form the metal material layer, the first electrolyte is electrified under a first reduction potential or a first reduction current, so that the first ions are reduced and deposited on the photoresist layer with the pattern to form the metal material layer. Further, the first reduction potential ranges from 0.34 V to 0.8 V, and a density of the first reduction current ranges from 1.5 A/dm$^2$ to 8 A/dm$^2$.

In one embodiment, in the step of placing the photoresist layer having the metal material layer formed thereon in the second electrolyte to perform electrochemical deposition, so that the second ions are reduced and deposited on the metal material layer to form the barrier material layer, the second electrolyte is electrified under a second reduction potential or a second reduction current, so that the second ions are reduced and deposited on the metal material layer to form the barrier material layer.

Further, the second ions are $MoO_4^{2-}$, the second reduction potential ranges from −0.3 V to 0.1 V, and a density of the second reduction current ranges from 0.5 A/dm$^2$ to 1.2 A/dm$^2$. In alternative embodiments, the second ions are $Ti^{2+}$, the second reduction potential ranges from −1.2 V to −1.7 V, and the density of the second reduction current ranges from 5 A/dm$^2$ to 50 A/dm$^2$.

In the aforementioned method of manufacturing the gate unit, the first electrolyte containing the first ions and the second electrolyte containing the second ions are provided to electrochemically deposit the metal material layer and the barrier material layer, respectively. After the photoresist layer is removed, the metal layer and the barrier layer that are laminated are formed, the pattern layer with higher density can also be obtained, and the obtained gate unit can be used to manufacture the array substrate with shorter charging time.

Further, in the aforementioned method of manufacturing the gate unit, the metal layer is electrochemically deposited by using the first electrolyte containing the first ions, and after the first ions are consumed to a shorter concentration, the second ions are added into the first electrolyte to obtain the second electrolyte, so that the metal material layer is electrochemically deposited. Therefore, the metal material layer and the barrier material layer can be continuously deposited by controlling the concentrations of the first ions and the second ions, which can effectively avoid oxidization or contamination of the metal layer affecting the conductivity of the gate unit.

It may be understood that the first electrolyte is not limited to the first electrolyte mentioned above, and the first electrolyte may also be the same as that in the first embodiment. In this case, the first reduction potential or the first reduction current needs to be adjusted so that the first ions in the first electrolyte are reduced without simultaneously reducing the second ions.

Figure 8:
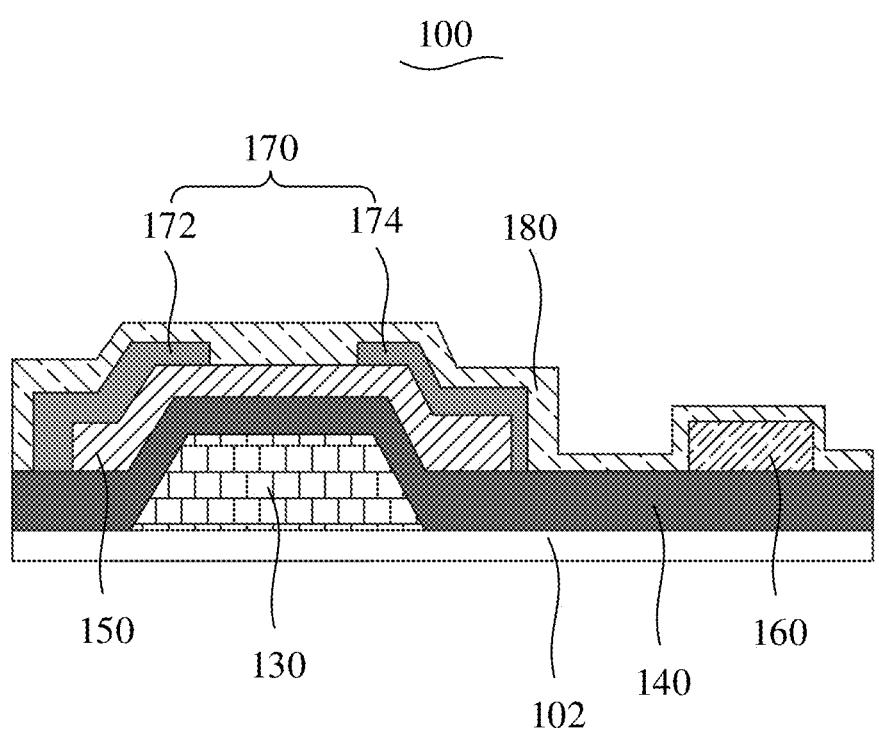
FIG. 8 is a schematic view of an array substrate according to an embodiment.
Figure 9:
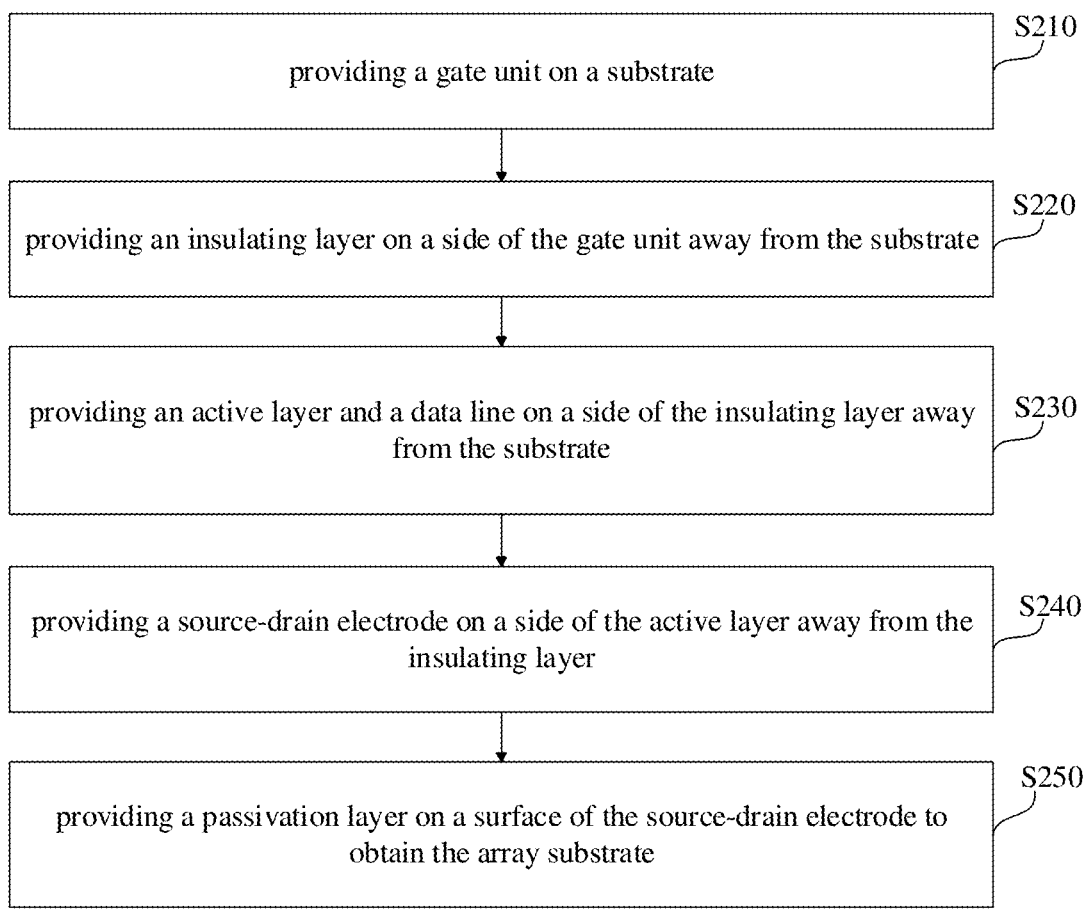
FIG. 9 is a flow chart of a method of manufacturing the array substrate of FIG. 8.

Referring to FIGS. 8 to 9 together, a method of manufacturing an array substrate 100 according to an embodiment is provided, by which the array substrate 100 with a shorter charging time can be manufactured. The method of manufacturing the array substrate 100 includes the following steps S210-S250.

Figure 10:
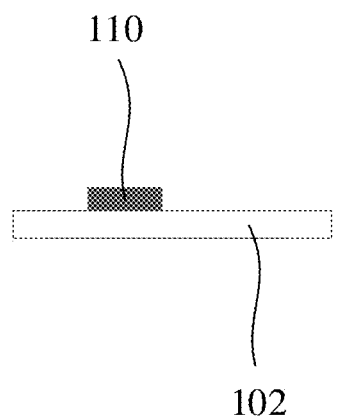
FIG. 10 is a schematic view illustrating a structure after providing a gate on a substrate in the method of manufacturing the array substrate of FIG. 8.

Referring to FIG. 10 together, in S210, a gate unit 110 is provided on a substrate 102.

In one embodiment, the gate unit 110 is manufactured by the method of manufacturing the gate unit 110 according to the first embodiment or the method of manufacturing the gate unit 110 according to the second embodiment.

In a specific example, the gate unit 110 includes a gate 112 and a gate line.

In S220, an insulating layer 140 is provided on a side of the gate unit 110 away from the substrate 102.

Further, the insulating layer 140 covers the side of the substrate 102 adjacent to the gate unit 110, and covers the gate unit 110.

In one embodiment, the insulating layer 140 is provided on the side of the gate unit 110 away from the substrate 102 by vapor deposition or electrochemical deposition.

In one embodiment, the insulating layer 140 is SiNx, $SiO_2$, or $Al_2O_3$.

In one embodiment, the insulating layer 140 has a thickness ranging from 2000 A to 5000 A.

In S230, an active layer 150 and a data line 160 are provided on a side of the insulating layer 140 away from the substrate 102.

In one embodiment, the active layer 150 is disposed opposite to the gate 112.

In one embodiment, the active layer 150 is a semiconductor layer. Further, the active layer 150 is an amorphous silicon layer. It should be noted that the active layer 150 is not limited to an amorphous silicon layer, and may also be other semiconductor layers, such as polysilicon or metal oxides.

In one embodiment, the active layer 150 has a thickness ranging from 600 A to 2000 A.

In one embodiment, the active layer 150 is provided on the side of the insulating layer 140 away from the substrate 102 by using a deposition process. Further, the deposition is vapor deposition or electrochemical deposition. Furthermore, the deposition is vacuum evaporation, sputtering coating, arc plasma plating, or ion plating.

In one embodiment, the data line 160 has a thickness ranging from 2500 A to 6000 A.

In one embodiment, the data line 160 and the active layer 150 are spaced apart from each other.

In one embodiment, the step of providing the data line 160 on the side of the insulating layer 140 away from the substrate 102 includes: sequentially providing a metal layer and a photoresist layer on the side of the insulating layer 140 away from the substrate 102; and exposing and developing the photoresist layer through a yellow light process, and etching the metal layer to pattern the metal layer, so as to obtain the data line 160.

In S240, a source-drain electrode 170 is provided on a side of the active layer 150 away from the insulating layer 140.

In one embodiment, the source-drain electrode 170 has a thickness ranging from 2500 A to 6000 A.

In one embodiment, one part of the source-drain electrode 170 covers the side of the insulating layer 140 away from the substrate 102, and the other part thereof covers a surface of the active layer 150.

Further, the source-drain electrode 170 includes a drain electrode 172 and a source electrode 174. The drain electrode 172 and the source electrode 174 are spaced apart from each other. One part of the drain electrode 172 covers the side of the insulating layer 140 away from the substrate 102, and the other part thereof covers the surface of the active layer 150. One part of the source electrode 174 covers the side of the insulating layer 140 away from the substrate 102, and the other part thereof covers the surface of the active layer 150. The source electrode 174 is electrically connected to the data line 160.

In one embodiment, the step of providing the source-drain electrode 170 on the side of the active layer 150 away from the insulating layer 140 includes: sequentially providing a metal layer and a photoresist layer on the side of the active layer 150 away from the insulating layer 140; and exposing and developing the photoresist layer through a yellow light process, and etching the metal layer to pattern the metal layer, so as to obtain the source-drain electrode 170.

In one embodiment, after S230 and prior to S240, the method further includes providing an ohmic contact layer on the side of the active layer 150 away from the insulating layer 140. The ohmic contact layer is located between the active layer 150 and the source-drain electrode 170. By providing the ohmic contact layer between the source-drain electrode 170 and the active layer 150, it is conducive to reducing a contact resistance between the drain and the active layer 150, and is also conducive to reducing a contact resistance between the source and the active layer 150.

Further, the ohmic contact layer covers the surface of the active layer 150. One part of the drain electrode 172 covers the side of the insulating layer 140 away from the substrate 102, and the other part thereof covers the ohmic contact layer. One part of the source electrode 174 covers the side of the insulating layer 140 away from the substrate 102, and the other part thereof covers the ohmic contact layer.

In one embodiment, the ohmic contact layer is provided on the side of the active layer 150 away from the insulating layer 140 by using a deposition process. Further, the deposition is vapor deposition or electrochemical deposition. Furthermore, the deposition is vacuum evaporation, sputtering coating, arc plasma plating, or ion plating.

In one embodiment, the ohmic contact layer is amorphous silicon with a doping concentration gradient or the same concentration of PH3.

In one embodiment, the ohmic contact layer has a thickness ranging from 200 A to 1000 A.

In S250, a passivation layer 180 is provided on a surface of the source-drain electrode 170 to obtain the array substrate 100.

Further, the passivation layer 180 covers a surface of the insulating layer 140, and covers the surface of the source-drain electrode 170 and the surface of the active layer 150.

The passivation layer 180 is provided to protect the drain electrode 172, the source electrode 174, the active layer 150, and other components.

In one embodiment, the passivation layer 180 is provided on the surface of the source-drain electrode 170 by chemical vapor deposition, atomic layer deposition, or the like.

In one embodiment, the passivation layer 180 is a silicon nitride layer. It should be noted that the passivation layer 180 is not limited to the silicon nitride layer, and may also be other passivation layers 180, such as silicon oxide, alumina, or the like.

In one embodiment, the passivation layer 180 has a thickness ranging from 1500 A to 5000 A.

It should be noted that the passivation layer 180 may be omitted. Correspondingly, S250 may be omitted.

In the aforementioned method of manufacturing the array substrate 100, the pattern layer 118 of the gate 126 and the gate 126 are manufactured at normal temperature in a liquid phase by an electrochemical deposition process, so that a problem that coarse particles are formed to affect poor surface flatness of the pattern layer 118 is avoided, and thus the problem of decreasing the conductivity of the gate 126 due to the poor flatness of the pattern layer 118 can be avoided. In addition, the metal layer 1182 being made of copper can improve the conductivity of the gate 126, reduce the RC time, improve a refresh rate of the array substrate 100, and reduce the charging time of the array substrate 100. The aforementioned method of manufacturing the array substrate 100 can be used to manufacture the array substrate 100 with better performance, which can meet requirements of large-scale and batch production.

In addition, an array substrate 100 according to an embodiment is further provided, which is manufactured by using the method of manufacturing the array substrate according to the above embodiments.

The aforementioned array substrate 100 has a short RC time and a short charging time, which can be used to manufacture a display mechanism with a higher refresh rate and a shorter charging time.

In addition, a display mechanism according to an embodiment is further provided, including the array substrate 100 in the above embodiments.

In one embodiment, the display mechanism is a liquid crystal display panel, an organic light-emitting diode (OLED) display panel 10, or a quantum dot light emitting diode (QLED) display panel 10. The aforementioned display mechanism has a higher refresh rate and a shorter charging time, which can be used to manufacture a display device with excellent performance.

Figure 11:
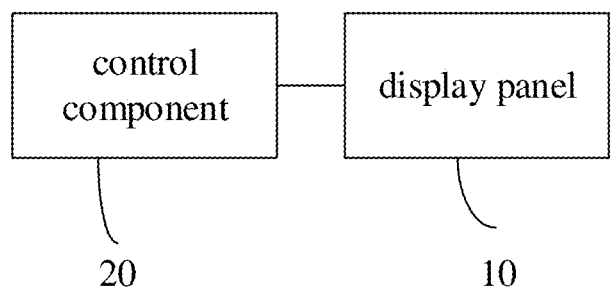
FIG. 11 is a schematic view of a display mechanism according to an embodiment.

Referring to FIG. 11 together, in one embodiment, the display mechanism includes a display panel 10 according to the above-mentioned embodiments and a control component 20.

Figure 12:
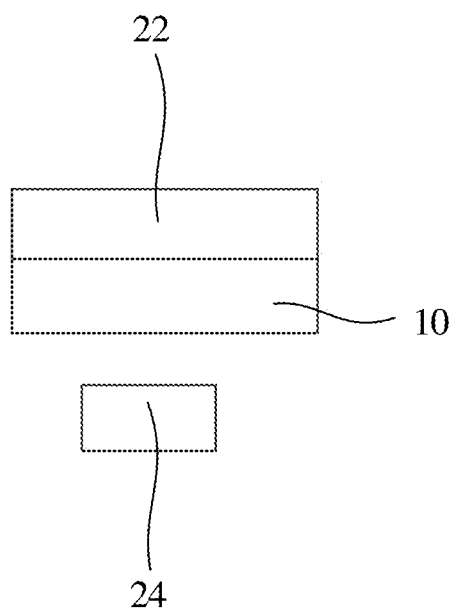
FIG. 12 is a schematic view of a display mechanism according to another embodiment.

Referring to FIG. 12 together, in one embodiment, the control component 20 includes at least one of a polarization module 22 and a backlight module 24. The backlight module

24 is used to provide a backlight, and the polarization module 22 is used to polarize light. Further, the control component 20 includes the polarization module 22 and the backlight module 24 that are located on both sides of the display panel 10.

In one embodiment, the display mechanism is a liquid crystal display device, an OLED display device, or a QLED display device.

In one embodiment, the display mechanism is a curved display panel. It should be noted that the display device is not limited to the curved display panel, and may also be a flat display panel.

The following are specific embodiments.

In the following examples, other components except inevitable impurities are not included unless otherwise specified. The drugs and instruments used in the examples are all routine in the art unless otherwise specified. The experimental procedures without specifying the specific conditions in the examples are carried out under the conventional conditions such as those described in the prior art or those recommended by the manufacturer.

In the following examples, unless otherwise specified, $Cu^{2+}$ is added in a form of copper sulfate and $MoO_4^{2-}$ is added in a form of sodium molybdate, and $Ti^{2+}$ is added in a form of titanium chloride. Chloride ions in the electrolyte indicated in the following examples are chloride ions in the soluble chloride salt. The substrate is a glass substrate.

Example 1

A method of manufacturing an array substrate in this example is as follows.

(1) A gate unit including a gate and a gate line was formed on a substrate. The steps of forming the gate unit on the substrate were as follows.

(a) A conductive layer was sputtered on the substrate. The conductive layer was a molybdenum layer, a thickness of the conductive layer was 300 A, and a thickness of the substrate was 0.3 mm.

(b) A photoresist layer was coated on a side of the conductive layer away from the substrate, and a thickness of the photoresist layer was 1.5 μm.

(c) The photoresist layer was exposed by using a mask, and then was developed to form a groove extending through the photoresist layer on the photoresist layer, so as to form the photoresist layer with a pattern.

(d) A functional material was electrochemically deposited on the photoresist layer with the pattern, and the photoresist layer was stripped to obtain a metal layer and a barrier layer that are laminated, so as to obtain the conductive layer having a pattern layer formed thereon, thereby obtaining the gate unit including the conductive layer and the pattern layer that are laminated. The step of electrochemically depositing the functional material on the photoresist layer with the pattern included: placing the photoresist layer with the pattern in an electrolyte; electrifying the electrolyte under a first reduction potential, so that first ions are reduced and deposited on the photoresist layer with the pattern to form a metal material layer; and electrifying the electrolyte under a second reduction potential, so that second ions are reduced and deposited on the metal material layer to form a barrier material layer. The electrochemical deposition was carried out in the same electrolyte to continuously electrochemically deposit a metal material and a barrier material. The electrolyte consisted of the following components: 1.5 mol/L of $Cu^{2+}$, 0.25 mol/L of $MoO_4^{2-}$, 30 g/L of acid, 0.3 mL/L of brightener, 30 mg/L of chloride ions, 0.1 mL/L of leveling agent, and 0.1 mL/L of additive. The acid was $H_2SO_4$, the brightener was sodium dodecyl sulfate, the soluble chloride salt was sodium chloride, and the leveling agent was polystyrene. The first reduction potential was 0.3419 V, and a thickness of the metal layer was 3000 A. The second reduction potential was −0.0036 V, and a thickness of the barrier layer was 300 A. A temperature of the electrochemical deposition was 10° C.

(2) An insulating layer was provided on a side of the gate unit away from the substrate. The insulating layer was a silicon nitride layer, and a thickness of the insulating layer was 4000 A.

(3) An active layer was provided on a side of the insulating layer away from the substrate. The active layer was opposite to the gate. The active layer was an amorphous silicon layer, and a thickness of the active layer was 1500 A.

(4) A data line was provided on the side of the insulating layer away from the substrate, and the data line was spaced apart from the active layer. The steps of providing the data line on the side of the insulating layer away from the substrate were as follows.

(a) A conductive layer was sputtered on the side of the insulating layer away from the substrate. The conductive layer was a titanium layer, and a thickness of the conductive layer was 250 A.

(b) A metal layer and a barrier layer were sequentially sputtered on a side of the conductive layer away from the substrate. The metal layer was made of copper, and a thickness of the metal layer was 3200 A. The barrier layer was made of titanium, and a thickness of the barrier layer was 400 A.

(c) A photoresist layer was coated on a side of the barrier layer away from the substrate.

(d) A side of the photoresist layer away from the barrier layer was exposed by using a mask, and then was developed to form a groove extending through the photoresist layer on the photoresist layer to form the photoresist layer with the pattern. The metal layer and the barrier layer were etched by using an etching process until the conductive layer was exposed, the photoresist layer was removed, and the conductive layer having the pattern layer formed thereon was formed from the conductive layer, the unetched metal layer, and the unetched barrier layer. The step of etching the metal layer and the barrier layer by using the etching process until the conductive layer was exposed was as follows: placing the photoresist layer having the groove formed thereon in an etching solution for etching. The etching solution consisted of the following components: 5 g/L of $HNO_3$, 40 g/L of $H_3PO_4$, and 20 g/L of oxalic acid. The etching temperature was 30° C., and the etching time was 85 s.

(5) A source-drain electrode was provided on a surface of the active layer. The steps of providing the source-drain electrode on the surface of the active layer were as follows.

(a) A conductive layer was sputtered on the surface of the active layer. The conductive layer was a titanium layer, and a thickness of the conductive layer was 250 A.

(b) A metal layer and a barrier layer were sequentially sputtered on a side of the conductive layer away from the substrate. The metal layer was made of copper, and a thickness of the metal layer was 3200 A. The barrier layer was made of titanium, and a thickness of the barrier layer was 400 A.

(c) A photoresist layer was coated on a side of the barrier layer away from the substrate.

(d) A side of the photoresist layer away from the barrier layer was exposed by using a mask, and then was developed to form a groove extending through the photoresist layer on the photoresist layer to form the photoresist layer with the pattern. The metal layer and the barrier layer were etched by using an etching process until the conductive layer was exposed, the photoresist layer was removed, and the conductive layer having the pattern layer formed thereon was formed from the conductive layer, the unetched metal layer, and the unetched barrier layer. The step of etching the metal layer and the barrier layer by using the etching process until the conductive layer was exposed was as follows: placing the photoresist layer having the groove formed thereon in an etching solution for etching. The etching solution consisted of the following components: 5 g/L of $HNO_3$, 40 g/L of $H_3PO_4$, and 20 g/L of oxalic acid. The etching temperature was 30° C., and the etching time was 85 s.

(6) A passivation layer was provided on a surface of the source-drain electrode to obtain the array substrate. The passivation layer was silicon nitride, and a thickness of the passivation layer was 2500 A.

Example 2

A method of manufacturing an array substrate in this example is as follows.

(1) A gate unit including a gate and a gate line was formed on a substrate. The steps of forming the gate unit on the substrate were as follows.

(a) A conductive layer was sputtered on the substrate. The conductive layer was a molybdenum layer, a thickness of the conductive layer was 800 A, and a thickness of the substrate was 1.0 mm.

(b) A photoresist layer was coated on a side of the conductive layer away from the substrate, and a thickness of the photoresist layer was 2.5 µm.

(c) The photoresist layer was exposed by using a mask, and then was developed to form a groove extending through the photoresist layer on the photoresist layer, so as to form the photoresist layer with a pattern.

(d) A functional material was electrochemically deposited on the photoresist layer with the pattern, and the photoresist layer was stripped to obtain a metal layer and a barrier layer that are laminated, so as to obtain the conductive layer having a pattern layer formed thereon, thereby obtaining the gate unit including the conductive layer and the pattern layer that are laminated. The step of electrochemically depositing the functional material on the photoresist layer with the pattern included: placing the photoresist layer with the pattern in an electrolyte; electrifying the electrolyte under a first reduction potential, so that first ions are reduced and deposited on the photoresist layer with the pattern to form a metal material layer; and electrifying the electrolyte under a second reduction potential, so that second ions are reduced and deposited on the metal material layer to form a barrier material layer. The electrochemical deposition was carried out in the same electrolyte to continuously electrochemically deposit a metal material and a barrier material. The electrolyte consisted of the following components: 4.0 mol/L of $Cu^{2+}$, 0.5 mol/L of $MoO_4^{2-}$, 100 g/L of acid, 1 mL/L of brightener, 120 mg/L of chloride ions, 0.8 mL/L of leveling agent, and 1.5 mL/L of additive. The acid was HCl, the brightener was polyoxyethylene, the soluble chloride salt was potassium chloride, and the leveling agent was polyacrylic acid. The first reduction potential was 0.3419 V, and a thickness of the metal layer was 4000 A. The second reduction potential was −0.0036 V, and a thickness of the barrier layer was 800 A. A temperature of the electrochemical deposition was 35° C.

(2) An insulating layer was provided on a side of the gate unit away from the substrate. The insulating layer was a silicon dioxide layer, and a thickness of the insulating layer was 5000 A.

(3) An active layer was provided on a side of the insulating layer away from the substrate. The active layer was opposite to the gate. The active layer was an amorphous silicon layer, and a thickness of the active layer was 2000 A.

(4) A data line was provided on the side of the insulating layer away from the substrate, and the data line was spaced apart from the active layer. The steps of providing the data line on the side of the insulating layer away from the substrate were as follows.

(a) A conductive layer was sputtered on the side of the insulating layer away from the substrate. The conductive layer was a titanium layer, and a thickness of the conductive layer was 200 A.

(b) A metal layer and a barrier layer were sequentially sputtered on a side of the conductive layer away from the substrate. The metal layer was made of copper, and a thickness of the metal layer was 3200 A. The barrier layer was made of molybdenum nitride, and a thickness of the barrier layer was 400 A.

(c) A photoresist layer was coated on a side of the barrier layer away from the substrate.

(d) A side of the photoresist layer away from the barrier layer was exposed by using a mask, and then was developed to form a groove extending through the photoresist layer on the photoresist layer to form the photoresist layer with the pattern. The metal layer and the barrier layer were etched by using an etching process until the conductive layer was exposed, the photoresist layer was removed, and the conductive layer having the pattern layer formed thereon was formed from the conductive layer, the unetched metal layer, and the unetched barrier layer. The step of etching the metal layer and the barrier layer by using the etching process until the conductive layer was exposed was as follows: placing the photoresist layer having the groove formed thereon in an etching solution for etching. The etching solution consisted of the following components: 5 g/L of $HNO_3$, 40 g/L of $H_3PO_4$, and 20 g/L of oxalic acid. The etching temperature was 30° C., and the etching time was 85 s.

(5) A source-drain electrode was provided on a surface of the active layer. The steps of providing the source-drain electrode on the surface of the active layer were as follows.

(a) A conductive layer was sputtered on the surface of the active layer. The conductive layer was a titanium layer, and a thickness of the conductive layer was 200 A.

(b) A metal layer and a barrier layer were sequentially sputtered on a side of the conductive layer away from the substrate. The metal layer was made of copper, and a thickness of the metal layer was 3200 A. The barrier layer was made of molybdenum nitride, and a thickness of the barrier layer was 400 A.

(c) A photoresist layer was coated on a side of the barrier layer away from the substrate.

(d) A side of the photoresist layer away from the barrier layer was exposed by using a mask, and then was developed to form a groove extending through the photoresist layer on the photoresist layer to form the photoresist layer with the pattern. The metal layer and the barrier layer were etched by using an etching process until the conductive layer was exposed, the photoresist layer was removed, and the conductive layer having the pattern layer formed thereon was formed from the unetched metal layer and the unetched barrier layer. The step of etching the metal layer and the barrier layer by using the etching process until the conductive layer was exposed was as follows: placing the photoresist layer having the groove formed thereon in an etching solution for etching. The etching solution consisted of the following components: 5 g/L of $HNO_3$, 40 g/L of $H_3PO_4$, and 20 g/L of oxalic acid. The etching temperature was 30° C., and the etching time was 80 s.

(6) A passivation layer was provided on a surface of the source-drain electrode to obtain the array substrate. The passivation layer was silicon nitride, and a thickness of the passivation layer was 2500 A.

Example 3

A method of manufacturing an array substrate in this example is as follows.

(1) A gate unit including a gate and a gate line was formed on a substrate. The steps of forming the gate unit on the substrate were as follows.

(a) A conductive layer was sputtered on the substrate. The conductive layer was a molybdenum layer, a thickness of the conductive layer was 500 A, and a thickness of the substrate was 0.7 mm.

(b) A photoresist layer was coated on a side of the conductive layer away from the substrate, and a thickness of the photoresist layer was 2.2 μm.

(c) The photoresist layer was exposed by using a mask, and then was developed to form a groove extending through the photoresist layer on the photoresist layer, so as to form the photoresist layer with a pattern.

(d) A functional material was electrochemically deposited on the photoresist layer with the pattern, and the photoresist layer was stripped to obtain a metal layer and a barrier layer that are laminated, so as to obtain the conductive layer having a pattern layer formed thereon, thereby obtaining the gate unit including the conductive layer and the pattern layer that are laminated. The step of electrochemically depositing the functional material on the photoresist layer with the pattern included: placing the photoresist layer with the pattern in an electrolyte; electrifying the electrolyte under a first reduction potential, so that first ions are reduced and deposited on the photoresist layer with the pattern to form a metal material layer; and electrifying the electrolyte under a second reduction potential, so that second ions are reduced and deposited on the metal material layer to form a barrier material layer. The electrochemical deposition was carried out in the same electrolyte to continuously electrochemically deposit a metal material and a barrier material. The electrolyte consisted of the following components: 3 mol/L of $Cu^{2+}$, 0.4 mol/L of $MoO_4^{2-}$, 70 g/L of acid, 0.65 mL/L of brightener, 80 mg/L of chloride ions, 0.4 mL/L of leveling agent, and 0.8 mL/L of additive. The acid was $H_3PO_4$, the brightener was sodium propylene sulfonate, the soluble chloride salt was magnesium chloride, and the leveling agent was polyvinyl alcohol. The first reduction potential was 0.3419 V, and a thickness of the metal layer was 3500 A. The second reduction potential was −0.0036 V, and a thickness of the barrier layer was 400 A. A temperature of the electrochemical deposition was 10° C.

(2) An insulating layer was provided on a side of the gate unit away from the substrate. The insulating layer was a silicon nitride layer, and a thickness of the insulating layer was 4000 A.

(3) An active layer was provided on a side of the insulating layer away from the substrate. The active layer was opposite to the gate. The active layer was an amorphous silicon layer, and a thickness of the active layer was 1500 A.

(4) A data line was provided on the side of the insulating layer away from the substrate, and the data line was spaced apart from the active layer. The steps of providing the data line on the side of the insulating layer away from the substrate were as follows.

(a) A conductive layer was sputtered on the side of the insulating layer away from the substrate. The conductive layer was a titanium layer, and a thickness of the conductive layer was 250 A.

(b) A metal layer and a barrier layer were sequentially sputtered on a side of the conductive layer away from the substrate. The metal layer was made of copper, and a thickness of the metal layer was 3500 A. The barrier layer was made of molybdenum nitride, and a thickness of the barrier layer was 400 A.

(c) A photoresist layer was coated on a side of the barrier layer away from the substrate.

(d) A side of the photoresist layer away from the barrier layer was exposed by using a mask, and then was developed to form a groove extending through the photoresist layer on the photoresist layer to form the photoresist layer with the pattern. The metal layer and the barrier layer were etched by using an etching process until the conductive layer was exposed, the photoresist layer was removed, and the conductive layer having the pattern layer formed thereon was formed from the conductive layer, the unetched metal layer, and the unetched barrier layer. The step of etching the metal layer and the barrier layer by using the etching process until the conductive layer was exposed was as follows: placing the photoresist layer having the groove formed thereon in an etching solution for etching. The etching solution consisted of the following components: 5 g/L of $HNO_3$, 40 g/L of $H_3PO_4$, and 20 g/L of oxalic acid. The etching temperature was 30° C., and the etching time was 85 s.

(5) A source-drain electrode was provided on a surface of the active layer. The steps of providing the source-drain electrode on the surface of the active layer were as follows.

(a) A conductive layer was sputtered on the surface of the active layer. The conductive layer was a titanium layer, and a thickness of the conductive layer was 250 A.

(b) A metal layer and a barrier layer were sequentially sputtered on a side of the conductive layer away from the substrate. The metal layer was made of copper, and a thickness of the metal layer was 3500 A. The barrier layer was made of titanium, and a thickness of the barrier layer was 400 A.

(c) A photoresist layer was coated on a side of the barrier layer away from the substrate.

(d) A side of the photoresist layer away from the barrier layer was exposed by using a mask, and then was developed to form a groove extending through the photoresist layer on the photoresist layer to form the photoresist layer with the pattern. The metal layer and the barrier layer were etched by using an etching process until the conductive layer was exposed, the photoresist layer was removed, and the conductive layer having the pattern layer formed thereon was formed from the conductive layer, the unetched metal layer, and the unetched barrier layer. The step of etching the metal layer and the barrier layer by using the etching process until the conductive layer was exposed was as follows: placing the photoresist layer having the groove formed thereon in an etching solution for etching. The etching solution consisted of the following components: 5 g/L of $HNO_3$, 40 g/L of $H_3PO_4$, and 20 g/L of oxalic acid. The etching temperature was 30° C., and the etching time was 85 s.

(6) A passivation layer was provided on a surface of the source-drain electrode to obtain the array substrate. The passivation layer was silicon nitride, and a thickness of the passivation layer was 2500 A.

Example 4

A method of manufacturing an array substrate in this example is substantially the same as that in Example 3. The difference lies in that, during a method of manufacturing an gate unit, the electrolyte consisted of the following components: 3 mol/L of $Cu^{2+}$, 0.4 mol/L of $Ti^{2+}$, 700 g/L of acid, 0.65 mL/L of brightener, 80 mg/L of chloride ions, 0.4 mL/L of leveling agent, and 0.8 mL/L of additive. The acid was $H_3PO_4$, the brightener was sodium propylene sulfonate, the soluble chloride salt was magnesium chloride, and the leveling agent was polyvinyl alcohol. The first reduction potential was 0.3419 V, and a thickness of the metal layer was 3500 A. The second reduction potential was −1.4 V, and a thickness of the barrier layer was 400 A. A temperature of the electrochemical deposition was 10° C.

Example 5

A method of manufacturing an array substrate in this example is substantially the same as that in Example 1. The difference lies in that, the steps of forming a gate unit on a substrate were as follows.

(a) A conductive layer was sputtered on the substrate. The conductive layer was a molybdenum layer, a thickness of the conductive layer was 300 A, and a thickness of the substrate was 0.3 mm.

(b) A photoresist layer was coated on a side of the conductive layer away from the substrate, and a thickness of the photoresist layer was 1.5 μm.

(c) The photoresist layer was exposed by using a mask, and then was developed to form a groove extending through the photoresist layer on the photoresist layer, so as to form the photoresist layer with a pattern.

(d) A functional material was electrochemically deposited on the photoresist layer with the pattern, and the photoresist layer was stripped to obtain a metal layer and a barrier layer that are laminated, so as to obtain the conductive layer having a pattern layer formed thereon, thereby obtaining the gate unit including the conductive layer and the pattern layer that are laminated. The step of electrochemically depositing the functional material on the photoresist layer with the pattern included: placing the photoresist layer having the groove formed thereon in a first electrolyte, and performing an electrochemical deposition at a first reduction potential, so that first ions are reduced and deposited on the photoresist layer with the pattern to form a metal material layer; and when the first ions in the first electrolyte are decreased to below 0 mol/L, adding second ions into the first electrolyte and adjusting a potential to a second reduction potential to continue the electrochemical deposition, so that the second ions are reduced and deposited on the metal material layer to form a barrier material layer. The first reduction potential was 0.34 V. The second reduction potential was −0.3 V. A thickness of the metal layer was 3200 A. A thickness of the barrier layer was 300 A. The first electrolyte consisted of the following components: 1.5 mol/L of $Cu^{2+}$ (i.e., the first ions), 30 g/L of acid, 0.3 mL/L of brightener, 30 mg/L of chloride ions, 0.1 mL/L of leveling agent, and 0.1 mL/L of additive. The acid was $H_2SO_4$, the brightener was sodium dodecyl sulfate, the soluble chloride salt (i.e., the chloride ion) was sodium chloride, and the leveling agent was polystyrene. The second ions were added into the first electrolyte so that an initial concentration of the second ions were 0.25 mol/L. The second ions were $MoO_4^{2-}$. A temperature of the electrochemical deposition was 10° C.

Example 6

A method of manufacturing an array substrate in this example is substantially the same as that in Example 2. The difference lies in that, the steps of forming a gate unit on a substrate were as follows.

(a) A conductive layer was sputtered on the substrate. The conductive layer was a molybdenum layer, a thickness of the conductive layer was 800 A, and a thickness of the substrate was 1.0 mm.

(b) A photoresist layer was coated on a side of the conductive layer away from the substrate, and a thickness of the photoresist layer was 2.5 μm.

(c) The photoresist layer was exposed by using a mask, and then was developed to form a groove extending through the photoresist layer on the photoresist layer, so as to form the photoresist layer with a pattern.

(d) A functional material was electrochemically deposited on the photoresist layer with the pattern, and the photoresist layer was stripped to obtain a metal layer and a barrier layer that are laminated, so as to obtain the conductive layer having a pattern layer formed thereon, thereby obtaining the gate unit including the conductive layer and the pattern layer that are laminated. The step of electrochemically depositing the functional material on the photoresist layer with the pattern included: placing the photoresist layer having the groove formed thereon in a first electrolyte, and performing an electrochemical deposition at a first reduction potential, so that first ions are reduced and deposited on the photoresist layer with the pattern to form a metal material layer; and when the first ions in the first electrolyte are decreased to below 0 mol/L, adding second ions into the first electrolyte and adjusting a potential to a second reduction potential to continue the electrochemical deposition, so that the second ions are reduced and deposited on the metal material layer to form a barrier material layer. The first reduction potential was 0.8 V. The second reduction potential was 0.1 V. A thickness of the metal layer was 4000 A. A thickness of the barrier layer was 800 A. The first electrolyte consisted of the following components: 4.0 mol/L of $Cu^{2+}$ (i.e., the first ions), 100 g/L of acid, 1 mL/L of brightener, 120 mg/L of chloride ions, 0.8 mL/L of leveling agent, and 1.5 mL/L of additive. The acid was HCl, the brightener was polyoxyethylene, the soluble chloride salt was potassium chloride, and the leveling agent was polyacrylic acid. The second ions were added into the first electrolyte so that an initial concentration of the second ions were 0.5 mol/L. The second ions were $MoO_4^{2-}$. A temperature of the electrochemical deposition was 35° C.

Example 7

A method of manufacturing an array substrate in this example is substantially the same as that in Example 3. The difference lies in that, the steps of forming a gate unit on a substrate were as follows.

(a) A conductive layer was sputtered on the substrate. The conductive layer was a molybdenum layer, a thickness of the conductive layer was 500 A, and a thickness of the substrate was 0.7 mm.

(b) A photoresist layer was coated on a side of the conductive layer away from the substrate, and a thickness of the photoresist layer was 2.2 μm.

(c) The photoresist layer was exposed by using a mask, and then was developed to form a groove extending through the photoresist layer on the photoresist layer, so as to form the photoresist layer with a pattern.

(d) A functional material was electrochemically deposited on the photoresist layer with the pattern, and the photoresist layer was stripped to obtain a metal layer and a barrier layer that are laminated, so as to obtain the conductive layer having a pattern layer formed thereon, thereby obtaining the gate unit including the conductive layer and the pattern layer that are laminated. The step of electrochemically depositing the functional material on the photoresist layer with the pattern included: placing the photoresist layer having the groove formed thereon in a first electrolyte, and performing an electrochemical deposition at a first reduction potential, so that first ions are reduced and deposited on the photoresist layer with the pattern to form a metal material layer; and when the first ions in the first electrolyte are decreased to below 0 mol/L, adding second ions into the first electrolyte and adjusting a potential to a second reduction potential to continue the electrochemical deposition, so that the second ions are reduced and deposited on the metal material layer to form a barrier material layer. The first reduction potential was 0.55 V. The second reduction potential was −0.7 V. A thickness of the metal layer was 3500 Å. A thickness of the barrier layer was 400 Å. The first electrolyte consisted of the following components: 180 g/L of $Cu^{2+}$ (i.e., the first ions), 700 g/L of acid, 0.65 mL/L of brightener, 80 mg/L of chloride ions, 0.4 mL/L of leveling agent, and 0.8 mL/L of additive. The acid was $H_3PO_4$, the brightener was sodium propylene sulfonate, the soluble chloride salt was magnesium chloride, and the leveling agent was polyvinyl alcohol. The second ions were added into the first electrolyte so that an initial concentration of the second ions were 60 g/L. The second ions were $MoO_4^{2-}$. A temperature of the electrochemical deposition was 10° C.

Example 8

A method of manufacturing an array substrate in this example is substantially the same as that in Example 1. The difference lies in that, in step (1), a metal layer and a barrier layer were sequentially sputtered on a side of the conductive layer away from the substrate. A photoresist layer was coated on a side of the barrier layer away from the substrate. A side of the photoresist layer away from the barrier layer was exposed by using a mask, and then was developed to form a groove extending through the photoresist layer on the photoresist layer to form the photoresist layer with the pattern. The metal layer and the barrier layer were etched by using an etching process until the conductive layer was exposed, the photoresist layer was removed, and the conductive layer having the pattern layer formed thereon was formed from the conductive layer, the unetched metal layer, and the unetched barrier layer. The step of etching the metal layer and the barrier layer by using the etching process until the conductive layer was exposed was as follows: placing the photoresist layer having the groove formed thereon in an etching solution for etching. The etching solution consisted of the following components: 5 g/L of $HNO_3$, 40 g/L of $H_3PO_4$, and 20 g/L of oxalic acid. The etching temperature was 30° C., and the etching time was 85 s.

Example 9

A method of manufacturing an array substrate in this example is substantially the same as that in Example 1. The difference lies in that, in the step of sequentially electrochemically depositing a metal material and a barrier material on the photoresist layer with the pattern, the photoresist layer having the groove formed thereon was placed in a first electrolytic cell containing an electrolyte, and electrochemical deposition was carried out by using a first reduction potential to deposit the metal material in the groove; and the substrate was taken out and placed in a second electrolytic cell containing the same electrolyte, and electrochemical deposition was carried out by using a second reduction potential to deposit the barrier material in the groove, so as to sequentially deposit a metal material layer and a barrier material layer in the groove.

Test:

Conductivities of the gate units of the array substrates in Examples 1-9 and charging time of pixels in the array substrates were measured. In addition, the array substrates in Examples 1 to 9 were assembled into a liquid crystal display panel, and a refresh rate of the liquid crystal display panel was measured. The measurement results are shown in Table 1. Table 1 shows the conductivities of the gate units of the array substrates in Examples 1-9 and the charging time of the pixels in the array substrates, and the refresh rate of the liquid crystal display panel composed of the array substrates in Examples 1 to 9. The conductivities were measured by a four-point probe method. The refresh rate was measured by an oscilloscope.

TABLE 1

|  | Refresh rate (Hz) | Conductivity ($10^6$ s/m) | Charging time (μs) |
| --- | --- | --- | --- |
| Example 1 | 60 | 3.9 | 16.2 |
| Example 2 | 60 | 4.4 | 15.5 |
| Example 3 | 60 | 6.1 | 12.8 |
| Example 4 | 60 | 4.8 | 14.2 |
| Example 5 | 60 | 4.2 | 15.7 |
| Example 6 | 60 | 5.0 | 14.1 |
| Example 7 | 60 | 6.8 | 11.2 |
| Example 8 | 60 | 3.5 | 16.8 |
| Example 9 | 60 | 3.2 | 17.6 |

It can be seen from Table 1 that the conductivities of the gate units of the array substrates obtained in Examples 1-7 are $3.9*10^6$ S/m to $8.0*10^6$ S/m, all of which are higher than that in Example 8; and the charging time of the array substrates obtained in Examples 1-7 is 10 μs to 15 μs, all of which are less than that in Example 8. This indicates that the gate units manufactured by electrochemical deposition in the above embodiments have higher conductivities, and the time of charging pixels in the array substrates can be shortened. Moreover, the refresh rate of the liquid crystal display panel including the array substrates in Examples 1-7 is 60 Hz, which indicates that the liquid crystal display panel with a higher refresh rate can be manufactured according to the array substrates obtained by the manufacturing methods in the above embodiments. The time of charging pixels in the array substrates in Examples 5-7 is shorter than that in Examples 1-3, respectively, which indicates that the methods of manufacturing the array substrates in Examples 5-7 are more advantageous to shorten the time of charging pixels in the array substrates. Based on the above, the array substrate with a shorter charging time can be manufactured according to the manufacturing methods in the above embodiments.

Although the respective embodiments have been described one by one, it shall be appreciated that the respective embodiments will not be isolated. Those skilled in the art can apparently appreciate upon reading the disclosure of this application that the respective technical features involved in the respective embodiments can be combined arbitrarily between the respective embodiments as long as they have no collision with each other. Of course, the respective technical features mentioned in the same embodiment can also be combined arbitrarily as long as they have no collision with each other.

The foregoing descriptions are merely specific embodiments of the present invention, but are not intended to limit the protection scope of the present invention. Any variation or replacement readily figured out by a person skilled in the art within the technical scope disclosed in the present invention shall all fall within the protection scope of the present invention. Therefore, the protection scope of the present invention shall be subject to the protection scope of the appended claims.

What is claimed is:

1. A method of manufacturing a gate unit, comprising:
    providing a conductive layer on a substrate;
    forming a photoresist layer on a side of the conductive layer away from the substrate;
    exposing the photoresist layer, and then developing the photoresist layer to form a groove extending through the photoresist layer on the photoresist layer, so as to form the photoresist layer with a pattern; and
    electrochemically depositing a functional material on the photoresist layer with the pattern, and then removing the photoresist layer to obtain the conductive layer having a pattern layer formed thereon, so as to obtain the gate unit.

2. The method according to claim 1, wherein the step of electrochemically depositing the functional material on the photoresist layer with the pattern and then removing the photoresist layer to obtain the conductive layer having the pattern layer formed thereon comprises: sequentially electrochemically depositing a metal material and a barrier material on the photoresist layer with the pattern, and then removing the photoresist layer to form a metal layer and a barrier layer that are laminated to obtain the pattern layer.

3. The method according to claim 2, wherein the step of sequentially electrochemically depositing the metal material and the barrier material on the photoresist layer with the pattern comprises:
    placing the photoresist layer with the pattern in an electrolyte containing first ions and second ions;
    electrifying the electrolyte under a first reduction potential or a first reduction current, so that the first ions are reduced and deposited on the photoresist layer with the pattern to form a metal material layer; and
    electrifying the electrolyte under a second reduction potential or a second reduction current, so that the second ions are reduced and deposited on the metal material layer to form a barrier material layer.

4. The method according to claim 3, wherein the first ions are $Cu^{2+}$, the first reduction potential is 0.3419 V, a density of the first reduction current ranges from 1.5 $A/dm^2$ to 8.0 $A/dm^2$, the second reduction potential is −0.0036 V, and a density of the second reduction current ranges from 0.5 $A/dm^2$ to 1.2 $A/dm^2$.

5. The method according to claim 3, wherein the first ions are $Cu^{2+}$, the first reduction potential is 0.3419 V, a density of the first reduction current ranges from 1.5 $A/dm^2$ to 8.0 $A/dm^2$, the second ions are $Ti^{2+}$, the second reduction potential ranges from −1.2 V to −1.7 V, and a density of the second reduction current ranges from 5 $A/dm^2$ to 50 $A/dm^2$.

6. The gate unit preparation method according to claim 5, wherein prior to the step of placing the photoresist layer having the metal material layer formed thereon in the second electrolyte to perform electrochemical deposition, the method further comprises a step of preparing the second electrolyte: adding the second ions into the first electrolyte to obtain the second electrolyte.

7. The method according to claim 5, wherein the step of placing the photoresist layer with the pattern in the first electrolyte to perform electrochemical deposition comprises: electrifying the first electrolyte under a first reduction potential or a first reduction current, so that the first ions are reduced and deposited on the photoresist layer with the pattern to form the metal material layer, the first ions are $Cu^{2+}$, the first reduction potential ranges from 0.34 V to 0.8 V, and a density of the first reduction current ranges from 1.5 $A/dm^2$ to 8 $A/dm^2$.

8. The method according to claim 5, wherein the step of placing the photoresist layer having the metal material layer formed thereon in the second electrolyte to perform electrochemical deposition comprises: electrifying the second electrolyte under a second reduction potential or a second reduction current, so that the second ions are reduced and deposited on the metal material layer to form the barrier material layer, the second ions are $MoO_4^{2-}$ or $Ti^{2+}$,
    wherein when the second ions are $MoO_4^{2-}$, the second reduction potential ranges from −0.3 V to 0.1 V, and a density of the second reduction current ranges from 0.5 $A/dm^2$ to 1.2 $A/dm^2$; and when the second ions are $Ti^{2+}$, the second reduction potential ranges from −1.2 V to −1.7 V, and a density of the second reduction current ranges from 5 $A/dm^2$ to 50 $A/dm^2$.

9. The method according to claim 2, wherein the step of sequentially electrochemically depositing the metal material and the barrier material on the photoresist layer with the pattern comprises:
    placing the photoresist layer with the pattern in a first electrolyte containing first ions to perform electrochemical deposition, so that the first ions are reduced and deposited on the photoresist layer with the pattern to form a metal material layer; and
    placing the photoresist layer having the metal material layer formed thereon in a second electrolyte containing second ions to perform electrochemical deposition, so that the second ions are reduced and deposited on the metal material layer to form a barrier material layer.

10. A method of manufacturing an array substrate, comprising:
    providing a conductive layer on a substrate;
    forming a photoresist layer on a side of the conductive layer away from the substrate;
    exposing the photoresist layer, and then developing the photoresist layer to form a groove extending through the photoresist layer on the photoresist layer, so as to form the photoresist layer with a pattern;
    electrochemically depositing a functional material on the photoresist layer with the pattern, and then removing the photoresist layer to obtain the conductive layer having a pattern layer formed thereon, so as to obtain a gate unit;
    providing an insulating layer on a side of the gate unit away from the substrate;
    providing an active layer and a data line on a side of the insulating layer away from the gate unit; and
    providing a source-drain electrode on a side of the active layer away from the insulating layer to obtain the array substrate.

11. The method according to claim 10, wherein the step of providing the data line on the side of the insulating layer away from the gate unit comprises: sequentially providing a metal layer and a photoresist layer on the side of the insulating layer away from the gate unit, and exposing and developing the photoresist layer through a yellow light process, and etching the metal layer to pattern the metal layer, so as to obtain the data line.

12. The method according to claim 10, wherein the step of providing the source-drain electrode on the side of the active layer away from the insulating layer comprises: sequentially providing a metal layer and a photoresist layer on the side of the active layer away from the insulating layer, and exposing and developing the photoresist layer through a yellow light process, and etching the metal layer to pattern the metal layer, so as to obtain the source-drain electrode.

13. The method according to claim 10, wherein after the step of providing the active layer and the data line on the side of the insulating layer away from the gate unit and prior to the step of providing the source-drain electrode on the side of the active layer away from the insulating layer, the method further comprises: providing an ohmic contact layer on the side of the active layer away from the insulating layer, and the ohmic contact layer is located between the active layer and the source-drain electrode.

14. A display mechanism, comprising a gate unit manufactured by the method of manufacturing the gate unit according to claim 1 or an array substrate manufactured by the method of manufacturing the array substrate according to claim 10.

15. The display mechanism according to claim 10, further comprising a display panel and a control component.

16. The display mechanism according to claim 15, wherein the control component comprises at least one of a polarization module and a backlight module, the backlight module is configured to provide a backlight, and the polarization module is configured to polarize light.

* * * * *